(12) United States Patent
Mimlitch, III et al.

(10) Patent No.: US 7,591,056 B2
(45) Date of Patent: Sep. 22, 2009

(54) METHOD FOR ADAPTING TWO-POST RACK SYSTEMS TO SUPPORT FOUR-POST RACK MOUNTED EQUIPMENT

(75) Inventors: Robert H. Mimlitch, III, Rowlett, TX (US); David Anthony Norman, Greenville, TX (US)

(73) Assignee: Innovation First, Inc., Greenville, TX (US)

( * ) Notice: Subject to any disclaimer, the term of this patent is extended or adjusted under 35 U.S.C. 154(b) by 0 days.

(21) Appl. No.: 11/845,681

(22) Filed: Aug. 27, 2007

(65) Prior Publication Data

US 2008/0175659 A1    Jul. 24, 2008

Related U.S. Application Data

(62) Division of application No. 10/008,766, filed on Nov. 7, 2001, now Pat. No. 7,275,646.

(60) Provisional application No. 60/247,021, filed on Nov. 7, 2000.

(51) Int. Cl.
    *B21K 21/16*    (2006.01)
(52) U.S. Cl. .................................... 29/401.1
(58) Field of Classification Search ............... 29/401.1; 403/384, 167; 211/26; 361/725, 726, 727; 312/223.1
    See application file for complete search history.

(56) References Cited

U.S. PATENT DOCUMENTS

| 5,215,362 | A | 6/1993 | Zoellner |
| 5,340,340 | A | 8/1994 | Hastings et al. |
| 5,351,176 | A | 9/1994 | Smith et al. |
| 5,542,549 | A | 8/1996 | Siemon et al. |
| 5,571,256 | A | 11/1996 | Good |
| 5,772,294 | A | 6/1998 | Hendrich et al. |
| 5,833,337 | A | 11/1998 | Kofstad |
| 5,873,641 | A | 2/1999 | Spinelli |
| 5,941,621 | A | 8/1999 | Boulay et al. |
| 6,021,909 | A | 2/2000 | Tang et al. |
| 6,142,590 | A | 11/2000 | Harwell |
| 6,170,784 | B1 | 1/2001 | MacDonald et al. |
| 6,201,690 | B1 | 3/2001 | Moore et al. |
| 6,220,456 | B1 | 4/2001 | Jensen et al. |

(Continued)

OTHER PUBLICATIONS

Chatsworth Products, Inc., www.chatsworth.com, "*Dell Rack-Mount Server Solution*," Form No. MKT-60020-061-CH, Dec. 2001, 2 pages.

*Primary Examiner*—John C Hong
(74) *Attorney, Agent, or Firm*—Fish & Richardson P.C.

(57) ABSTRACT

Two-post rack systems may be adapted to support four-post rack mounted equipment. In one implementation, the system includes a coupling member for modifying a two-post equipment rack. The coupling member may include a vertical support member with first and second lateral ends and first and second longitudinal ends. A first torsion member may be coupled to the vertical support member at the first longitudinal end, and a second torsion member may be coupled to the vertical support member at the second longitudinal end. A coupling feature on the torsion members may be included to allow coupling to adjacent coupling members. An equipment attachment flange may be coupled to the first lateral end, and may further be adapted to emulate a vertical upright in a four-post rack.

18 Claims, 13 Drawing Sheets

U.S. PATENT DOCUMENTS

| | | | |
|---|---|---|---|
| 6,227,630 | B1 | 5/2001 | Brown et al. |
| 6,254,041 | B1 | 7/2001 | Dufourg |
| 6,349,837 | B1 | 2/2002 | Serban |
| 6,370,022 | B1 | 4/2002 | Hooper et al. |
| 6,422,399 | B1 | 7/2002 | Castillo et al. |
| 6,431,668 | B1 | 8/2002 | Redicliffe |
| 6,442,020 | B1 | 8/2002 | Liu et al. |
| 6,490,153 | B1 | 12/2002 | Casebolt et al. |
| 6,556,432 | B2 | 4/2003 | Chen et al. |
| 6,644,481 | B2 | 11/2003 | Dean et al. |
| 6,655,534 | B2 | 12/2003 | Williams et al. |
| 6,719,149 | B2 | 4/2004 | Tomino |
| 6,739,682 | B2 | 5/2004 | Shih |
| 6,974,037 | B2 | 12/2005 | Haney |
| 6,988,626 | B2 | 1/2006 | Varghese et al. |
| 7,134,558 | B1 | 11/2006 | Mimlitch, III et al. |
| 7,201,279 | B1 | 4/2007 | Mimlitch, III et al. |
| 2001/0040142 | A1 | 11/2001 | Haney |
| 2002/0043508 | A1 | 4/2002 | Lewis |
| 2003/0019822 | A1 | 1/2003 | Liu |
| 2003/0019823 | A1 | 1/2003 | Corbett, Jr. et al. |
| 2003/0205539 | A1 | 11/2003 | Lauchner et al. |
| 2007/0131628 | A1 | 6/2007 | Mimlitch, III et al. |
| 2007/0227992 | A1 | 10/2007 | Mimlitch, III et al. |

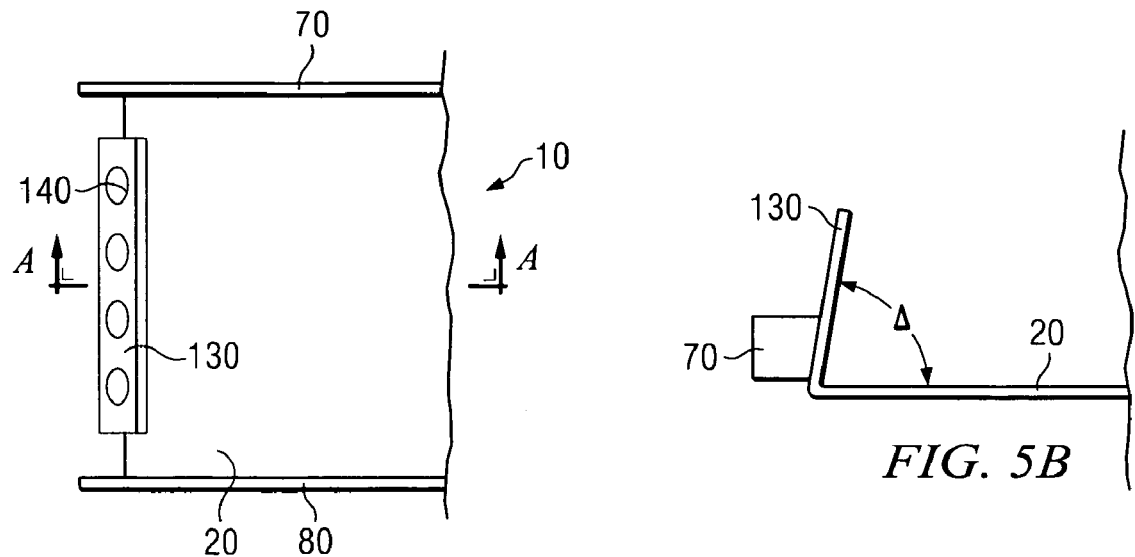
FIG. 5A
FIG. 5B
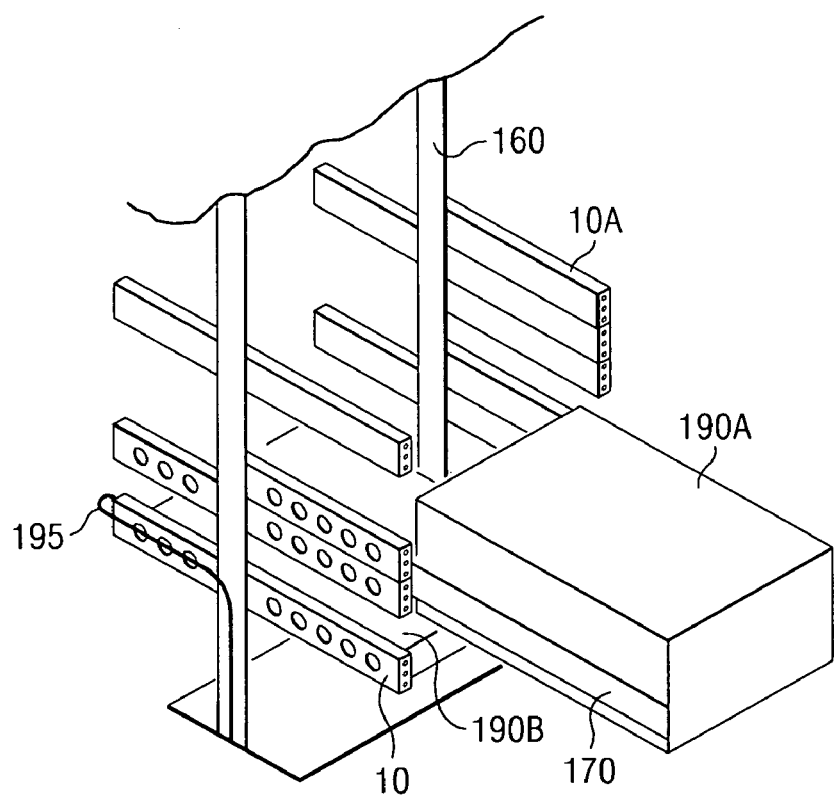
FIG. 6

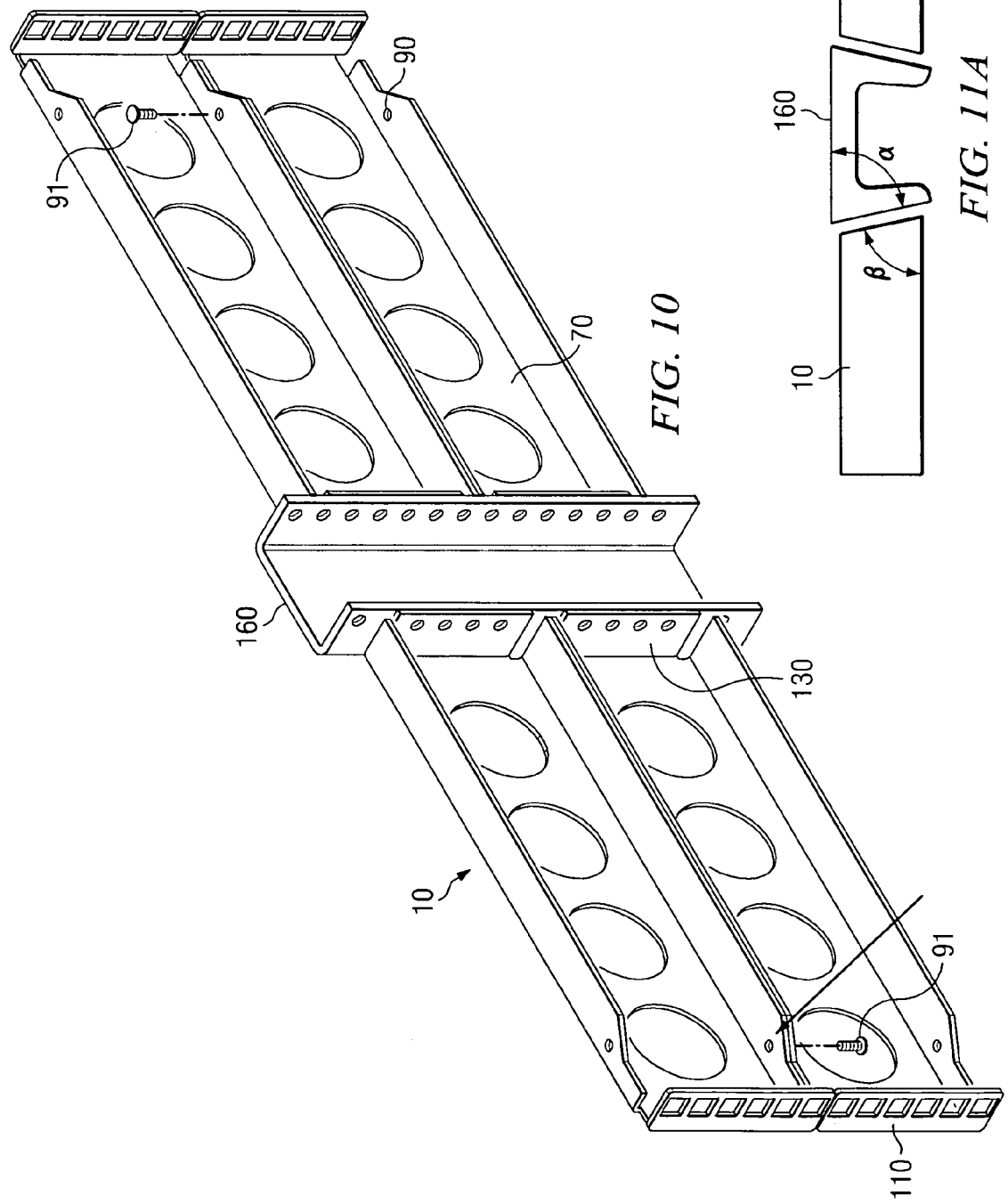

METHOD FOR ADAPTING TWO-POST RACK SYSTEMS TO SUPPORT FOUR-POST RACK MOUNTED EQUIPMENT

CLAIM OF PRIORITY

This application is a divisional of U.S. patent application Ser. No. 10/008,766, filed on Nov. 7, 2001 now U.S. Pat. No. 7,275,646, which claims priority to U.S. Provisional Application Ser. No. 60/247,021, filed on Nov. 7, 2000, the entire contents of which are hereby incorporated by reference.

BACKGROUND OF THE PRESENT INVENTION

1. Field of the Invention

The present invention generally relates to a support rack, and more specifically but not by way of limitation, to an apparatus and method for supporting four-post rack mounted equipment in a two-post equipment rack system.

2. Background

Equipment racks are used to support many different types of equipment or systems (e.g., computer servers). Many equipment manufacturers provide equipment with support mechanisms for being supported in traditional four-post rack systems (e.g., cabinets). Often, four-post racks, such as those shown in (Electronic Industries Association) EIA Standard EIA-310-D, incorporated herein by reference, can cost thousands of dollars while two-post equipment racks may only cost several hundred dollars. Therefore, users of four-post rack mountable equipment are interested in an economical, easy alternative to having to use four-post rack systems.

In today's ever-increasing technological world, many equipment systems are becoming smaller and smaller. However, there remain many systems that are still relatively large. As many modern corporations utilize these systems, it is generally desirable and economical to store these systems in one convenient location, which traditionally has been a four-post rack. These racks must be designed to handle the heavy and light loads of the different systems stored therein.

While a four-post rack traditionally has been the standard for users to mount these systems, due to the expense associated with the four-post racks, two-post equipment racks have been increasingly desirable. The two-post equipment racks provide the benefit of allowing equipment mounted thereto to be more accessible to a user. The two-post rack further takes up less real estate than fill four-post rack systems. However, because most equipment systems are pre-designed for four-post racks, the user has been subjected to having to purchase expensive four-post equipment racks to mount the equipment.

SUMMARY OF THE INVENTION

To overcome the problems of having to mount equipment systems having pre-designed four-post attachments, the principles of the present invention provide for an apparatus and method for adapting two-post rack systems to support four-post rack mounted equipment. In one embodiment, the apparatus includes a coupling member for modifying a two-post equipment rack. The coupling member may include a vertical support member having a first and second lateral end, and a first and second longitudinal end. A first torsion member may be coupled to the vertical support member at the first longitudinal end, and a second torsion member may be coupled to the vertical support member at the second longitudinal end. A coupling feature on the torsion members may be included to allow coupling to adjacent coupling members. An equipment attachment flange may be coupled to the first lateral end, and may further be adapted to emulate a vertical upright in a four-post rack. A rack attachment flange may be coupled to the second lateral end, and may be adapted to provide a load transfer path from the vertical support member to the two-post equipment rack. A lower flange end may be provided on the first and second torsion member, and may be adapted to provide a pivot point for load support.

One embodiment of a method for converting a two-post equipment rack may include a user first securing a first-load supporting member to a first post. The step may be repeated such that each post has two load-supporting members secured thereto, thereby replicating a four-post rack: A load, including a slide-rail and the like, may then be coupled to the load-supporting members. In certain embodiments, the load-supporting members may be secured to adjacent load supporting members to increase the load bearing strength of the load-supporting members.

BRIEF DESCRIPTION OF THE DRAWINGS

These and other features, aspects, and advantages of the present invention will become better understood with regard to the following description, appended claims, accompanying drawings where:

FIG. 5A is an exemplary top plan view of the rack attachment flange of the coupling member of FIG. 1;

FIG. 5B is a cross-section of FIG. 5A taken along line A-A;

FIG. 6 is an exemplary perspective view of a converted two-post equipment rack having the coupling members of FIG. 1 and/or FIG. 2 secured thereto and supporting a load thereon;

FIG. 10 is an exemplary perspective side view of two coupling members coupled together;

FIGS. 11A and 11B are top plan views of the coupling member showing the angle between a surface of a post and the coupling member;

DETAILED DESCRIPTION OF THE INVENTION

Current typical rack equipment storage devices, such as four-post racks, are very costly and space-consuming. However, despite the availability of less-expensive two-post equipment racks, there has not been available any means of attaching four-post equipment to two-post racks.

The present invention provides a solution to this dilemma. Several coupling members are provided herein which efficiently and economically secure to two-post racks and emulate four-post equipment racks, allowing four-post equipment to be stored thereon. In addition, the present invention may provide a convenient coupling feature between the coupling members, allowing heavier loads to be stored thereon. The present invention further provides a modular system for adapting the two-post racks, such that a user of the present invention can direct the placement of the coupling members. In addition, only the necessary number of coupling members in only the necessary locations may be utilized, thereby minimizing the number of brackets used to only those required for structural support.

The term "four-post rack load" or "load" as used herein refers to equipment or hardware that is commonly mounted in a four-post cabinet or rack. Computers, servers, disk arrays and other electronic-devices are a few examples of equipment. Sliding rails, shelves, monitor stands and other mechanical structures are a few examples of hardware that can be supported by the present invention. Most common four-post mounting equipment and hardware is designed to meet the EIA-310 standard, although other standards and variations exist.

Figure 1:
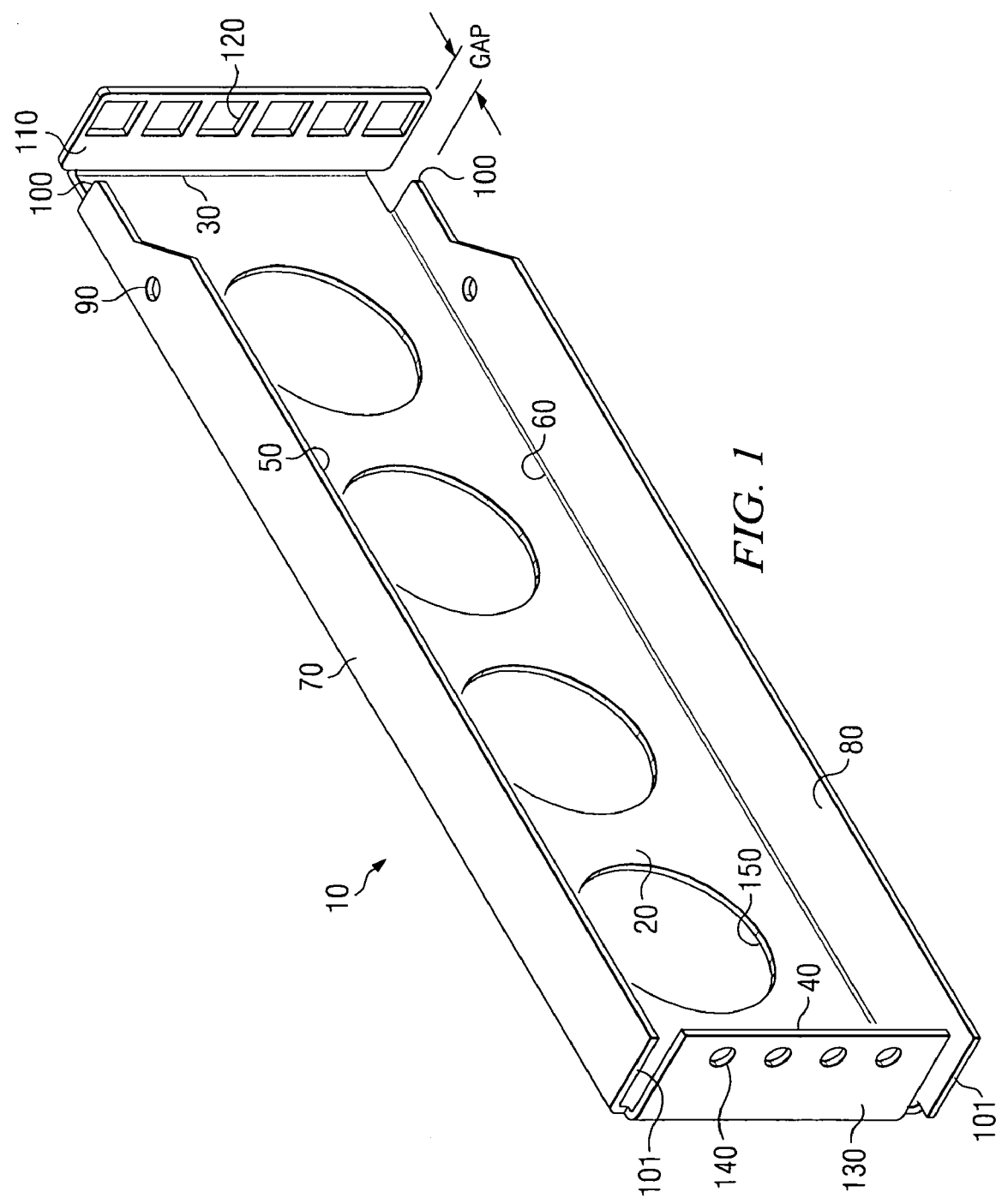
FIG. 1 is a perspective elevated view of an exemplary coupling member used to convert a two-post equipment rack to support four-post equipment.

Referring first to FIG. 1, there is shown a perspective view of a coupling member 10 for converting a two-post equipment rack system to a-four-post rack system. The coupling member 10 includes a vertical support member 20 having a first lateral end 30, a second lateral end 40, a first longitudinal end 50, and a second longitudinal end 60. A first torsion member 70 is coupled to the vertical support member 20 at the first longitudinal end 50. A second torsion member 80 is coupled to the vertical support member 20 at the second longitudinal end 60. First and second torsion member 70,80 generally reduce deflection and buckling of the coupling member 10.

As used herein, the terms adapter or converter and the respective derivatives refer to any structure capable of providing two- to four-post load support properties.

Figure 7A:
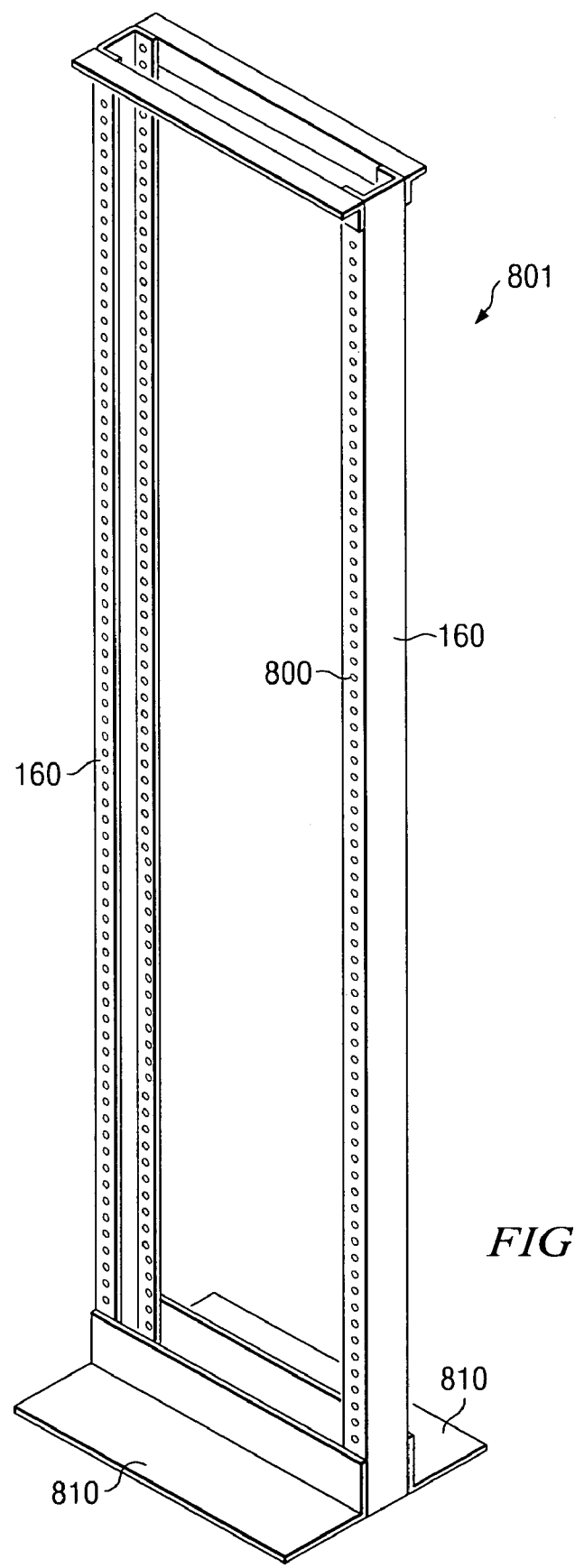
FIG. 7A is an exemplary perspective front side view of a two-post rack.

Referring now to FIG. 7A, there is shown an exemplary side perspective view of a two-post rack 801. The two post rack 810, also referred to as a telco rack and a relay rack, historically has been used for telephony equipment, relays, and patch panels. The two-post rack 801 consists of two vertical uprights 160, or posts, used for attaching equipment. These posts 160 are typically "C" shaped and have mounting features 800 on the front and rear of both posts 160. Two-post racks 801 typically have an overall depth of 2" to 10" from front mounting surface to back mounting surface. Functionally, a two-post rack 801 is very similar to a four-post-rack, aside from being shallow in depth. The holes of the mounting features 800 typically conform to the guidelines of the EIA-310 specification. Two-post racks 801 usually have a means of attaching the rack to the floor for stability, shown by the base 810. The hole pattern on the front and back 800 of the two posts 160 typically conform to the EIA-310 standard. The standard specifies the vertical hole spacing and the right post to left post hole spacing. This standard also describes a minimum opening between the right and left posts 160.

Figure 7B:
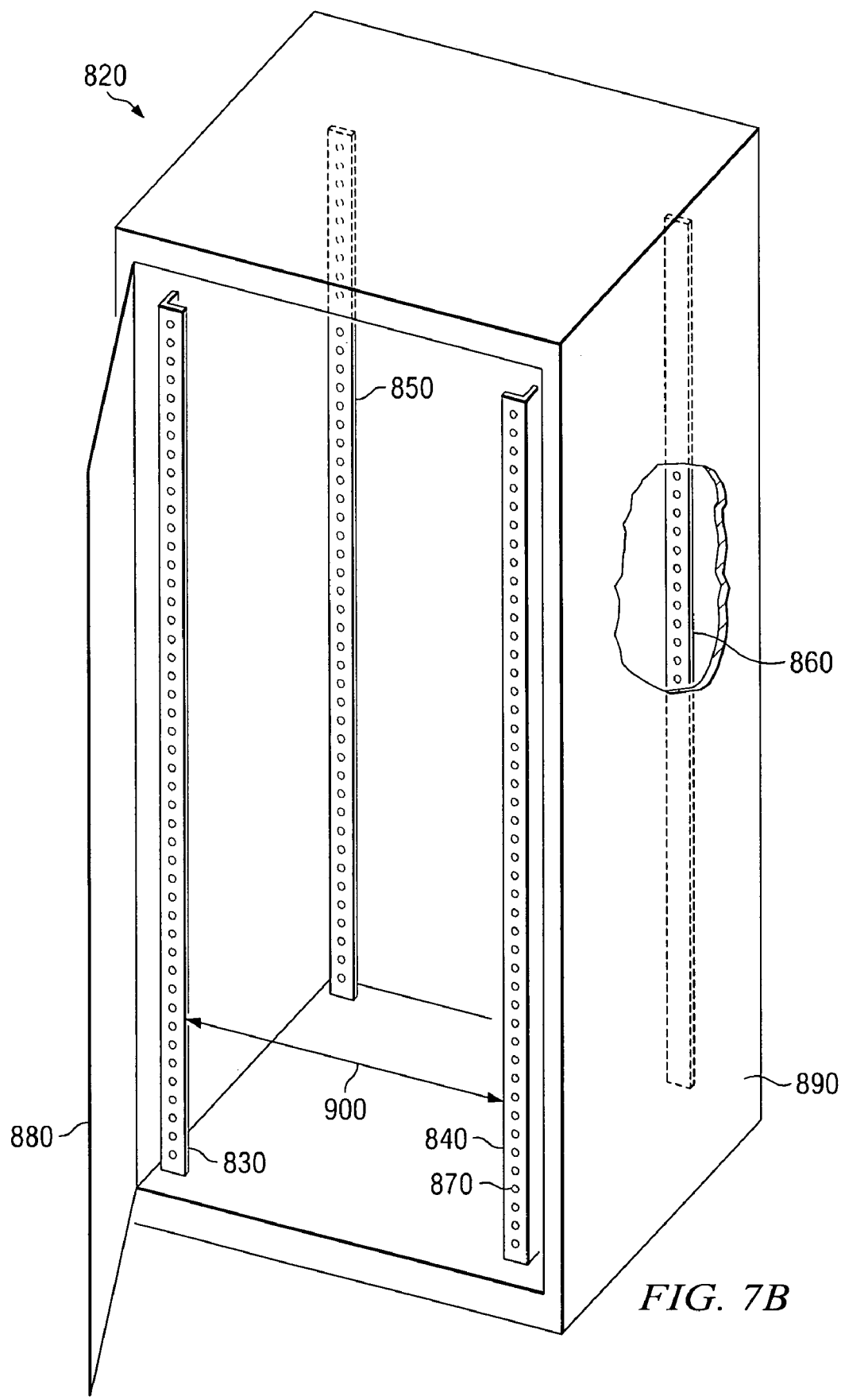
FIG. 7B is an exemplary side view of a load coupled to a two-post rack utilizing coupling members in accordance with the principles of the present invention.
Figure 8A:
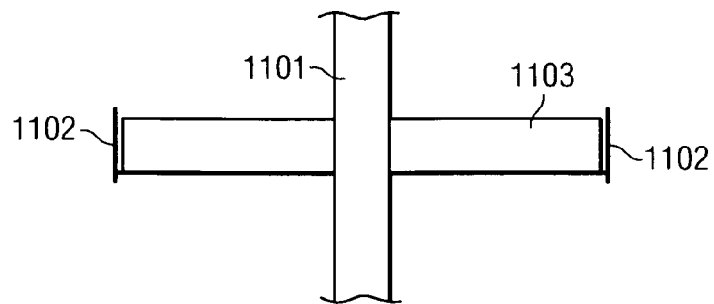
FIGS. 8A-8E are side views of exemplary embodiments according to the principles of the present invention.
Figure 8B:
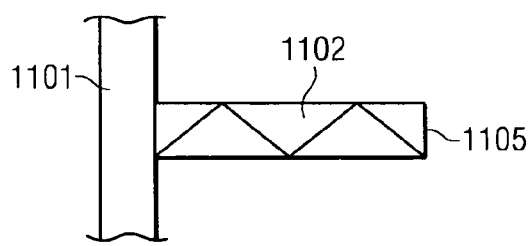
Figure 8C:
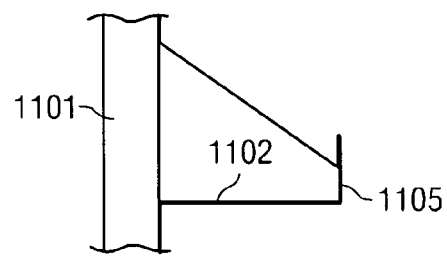
Figure 8D:
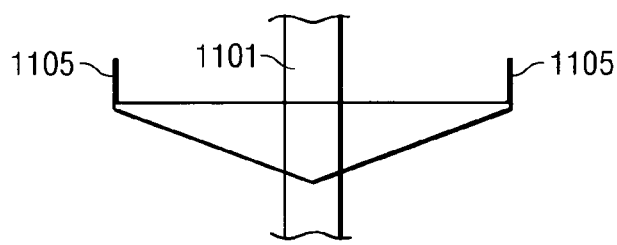
Figure 8E:
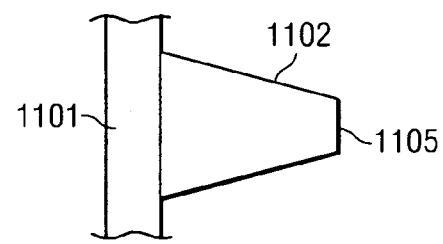

Referring now to FIG. 7B, there is shown an exemplary perspective side view of a four-post rack 820. Four-post racks 820 are often referred to as an equipment or cabinet rack. The four-post rack's chief feature is the provision of four vertical uprights 830, 840, 850, 860, or posts, used for attaching equipment. The four-post rack may or may not have side panels 890, front doors 880, and rear doors (not shown), top and bottom panels, and other features. Four-post racks 820 typically have an overall depth of 16" to 34" from a front post to a back post. Four-post racks 820 typically abide by the guidelines of the EIA-310 specification. The shape of the posts vary, however they all include mounting features 870 on the four posts facing front and back. The posts typically conform to the EIA-310 standard. The standard specifies the vertical hole spacing and the right post to left post hole spacing. This standard also describes a minimum opening 900 between the right and left posts.

Referring back to FIG. 1, a coupling feature 90 is provided on the first torsion member 70 and the second torsion member 80. The coupling feature is used to couple the coupling member 10 to adjacent coupling members (not shown in FIG. 1), thereby increasing the load supporting capability of the coupling member 10. As shown in this embodiment, the coupling feature 90 is an orifice through which a fastener, such as a screw and the like, may be used to secure the adjacent coupling members. The placement of the coupling feature 90 is exemplary in FIG. 1, and other locations and fasteners for the coupling member are contemplated to be within the scope of the present invention.

Figure 9:
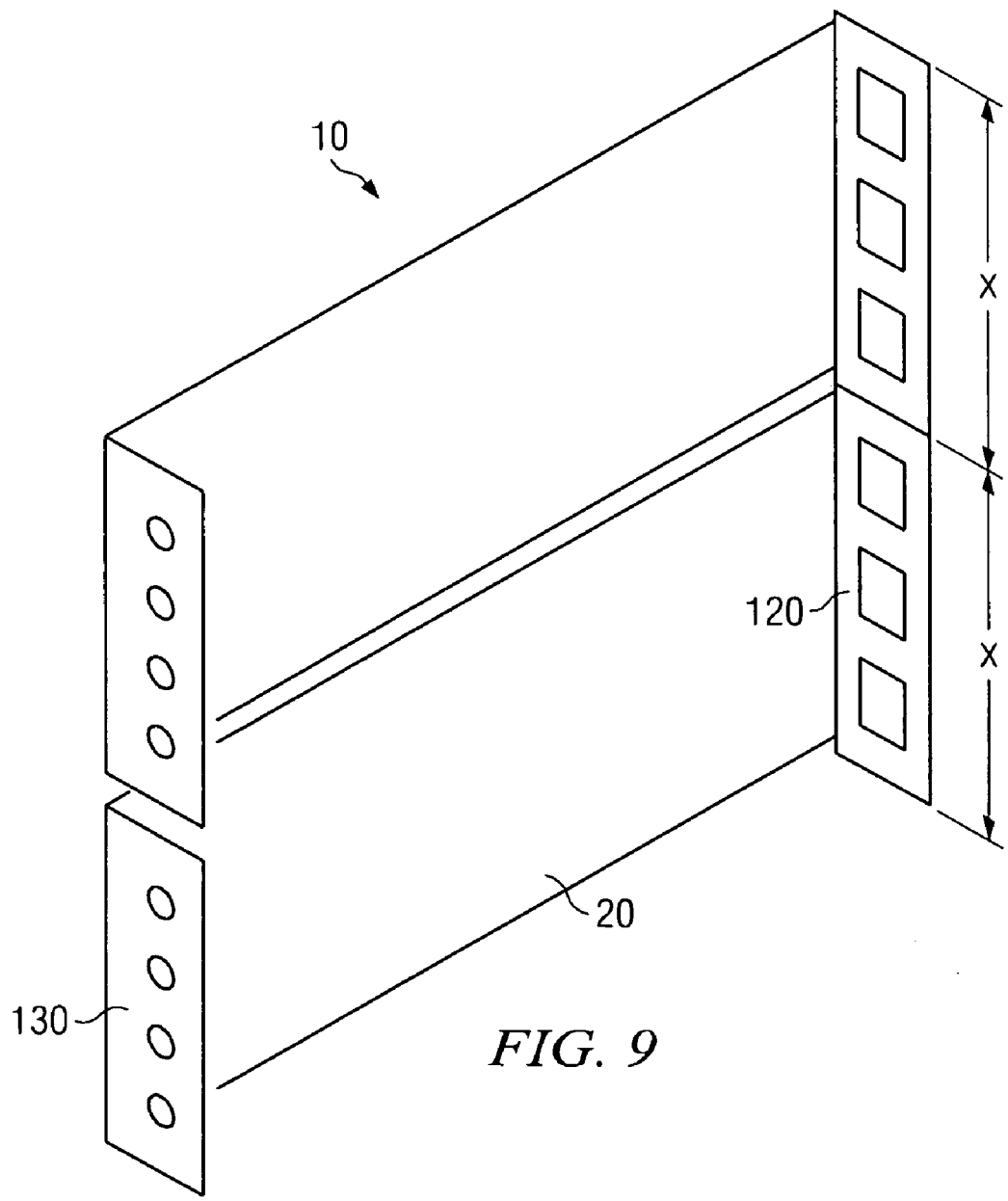
FIG. 9 is an exemplary perspective side view of two coupling members in a supporting configuration.

Referring now to FIG. 9, there is shown coupling members 10 adjacent to one another. In this exemplary configuration, the height X of the equipment attachment flange 120 is tightly controlled, such that the coupling members 10 may be stacked upon one another, and in this embodiment, the top coupling member benefits from the support received through the equipment attachment flange 120 to the bottom coupling member 10. There are certain advantages to making height X an even increment of "U", which may be defined as the modular unit on which panel heights are based, and is typically about 1.75". These include modularity advantages, because most loads are built based in increments of "U", and conservation of available "U" space is considered premium. In preferred embodiments, the coupling member 10 is formed in increments of one "U" in height.

Referring now to FIG. 10, there is a more detailed showing of the coupling feature 90 as described above. As can be seen in this embodiment, both coupling members 10 are supported equally due to the coupling thereof. Both coupling members on either side of the post 160 are secured to one another via a fastener 91 through the coupling feature 90.

Referring back to FIG. 1, in this embodiment the first torsion member 70 and second torsion member 80 each have a upper and lower flange ends 101 adapted to mate with the two-post rack. The lower flange end 101 also provides a pivot point for load support. The lower flange end 101 adds structural stability to loads supported by the coupling member 10, but is not required to adapt a two-post equipment rack to a four-post equipment rack.

Figure 11B:
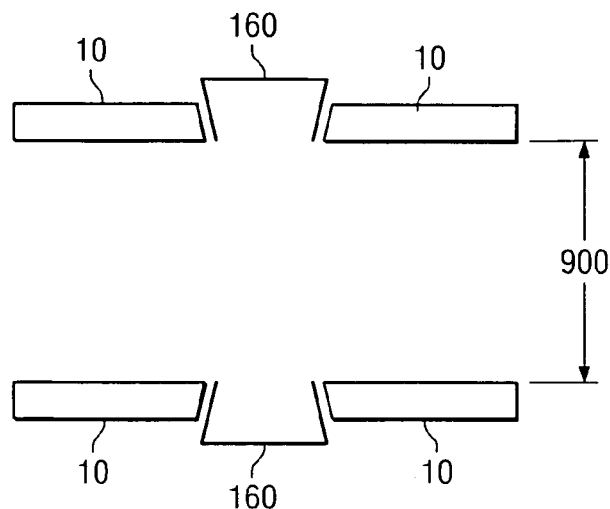

Referring now to FIGS. 11A and 11B, the angle-correction characteristics are shown in greater detail. As can be seen by the surface of the coupling member 10, the angle BETA compensates for the non-square mounting surface ALPHA found on two post racks. The non-square mounting surface ALPHA typically results from distortion in the posts due to cooling after extrusion of the posts. The obtuse angle on torsion members 70, 80 ensures that the coupling member are at least square and conform with EIA-310. This assists in the loading of four post rack loads into the racks by maintaining a proper opening 900.

Referring back to FIG. 1, in this embodiment the upper and lower flange ends 100 terminate prior to the first lateral end 30, creating a gap. This gap behind the flange 110 provides space for the attachment of loads that may extend above or below the height of the coupling member. It is contemplated that the first and second torsion members 70 and 80 extend entirely to the first lateral end 30.

Still referring to FIG. 1, an equipment attachment flange 110 may be coupled to the first lateral end 30. The equipment attachment flange 110 is intended to support loads. The equipment attachment flange 110 may be adapted to emulate a vertical upright in a common four-post rack (not shown) or to emulate the characteristics of a specific vendors rack, including attachment feature size and attachment feature location. In an alternative embodiment, a sliding rail (not shown) may be attached to the coupling member 10 to slide equipment mounted on the coupling member laterally. As used herein, the term "to emulate" means to imitate the function of. The equipment attachment flange 110, therefore, may be adapted to receive a sliding rail. The equipment attachment flange 110 may define a supporting point for a load. In addition, the equipment attachment flange 110 includes one or more orifices 120 for securing to various pieces of equipment. The orifices 120 may be adapted to emulate orifices found in four-post equipment racks. It is contemplated that the number, placement, size and configuration of the orifices 120 may vary, and may include a modular design. Such a design would allow for the creation of one orifice 120 that may be adapted to receive several connection points from equipment. The equipment attachment flange 110 is of a predetermined thickness, which may be adjusted depending on the requirements of the system. In certain preferred embodiments, the equipment attachment flange is substantially perpendicular to the vertical support member 20. However, in some embodiments the angle between the vertical support member 20 and the equipment attachment flange may be acute or obtuse.

Still referring to FIG. 1, a means for securing the coupling member 10 to a two-post equipment rack such as a rack attachment flange 130 may be coupled to the second lateral end 40. The rack attachment flange 130 may be adapted to provide a load transfer path from the vertical support member 20 to the two-post equipment rack (not shown in FIG. 1). The rack attachment flange 130 may include at least one rack connection point 140. In this embodiment, the rack attachment point 140 is an orifice adapted to mate with a like orifice from a two-post equipment rack. The rack attachment flange 130 may run the span of the second lateral end 40, or as is shown in FIG. 1, there may be a gap between the first torsion member 70, the rack attachment flange 130, and the second torsion member 80. A greater description of the rack attachment flange 130 is provided below in reference to FIGS. 5A and 5B.

Still referring to FIG. 1, although not required, it is preferred that the first torsion member 70 and the second torsion member 80 are coupled substantially perpendicular to the vertical support member 20. The thickness of the first torsion member 70 and second torsion member 80 may vary depending on the requirements of the system. In some embodiments utilizing more than one coupling member 10, it is advantageous to maintain the coupling members 10 independent of one another to not obstruct openings formed in the racks and to conform with EIA-310. The independence of these members 10 may be determined by the user based on the application.

As shown in FIG. 1, the coupling member 10 may be provided with one or more openings 150. The openings 150 may be utilized for air ventilation, weight reduction and aesthetics, among other reasons. The openings 150 may further be used as cable tie points, wherein equipment stored in the coupling member 10 may have cables extending therefrom. These cables may be secured to the coupling member 10 with tie wraps and the like at the openings 150. It is appreciated that the openings 150 are not integral to the load supporting function of the coupling member 10, but in certain instances may act as an aid in the load transfer through the coupling member 10.

Figure 2A:
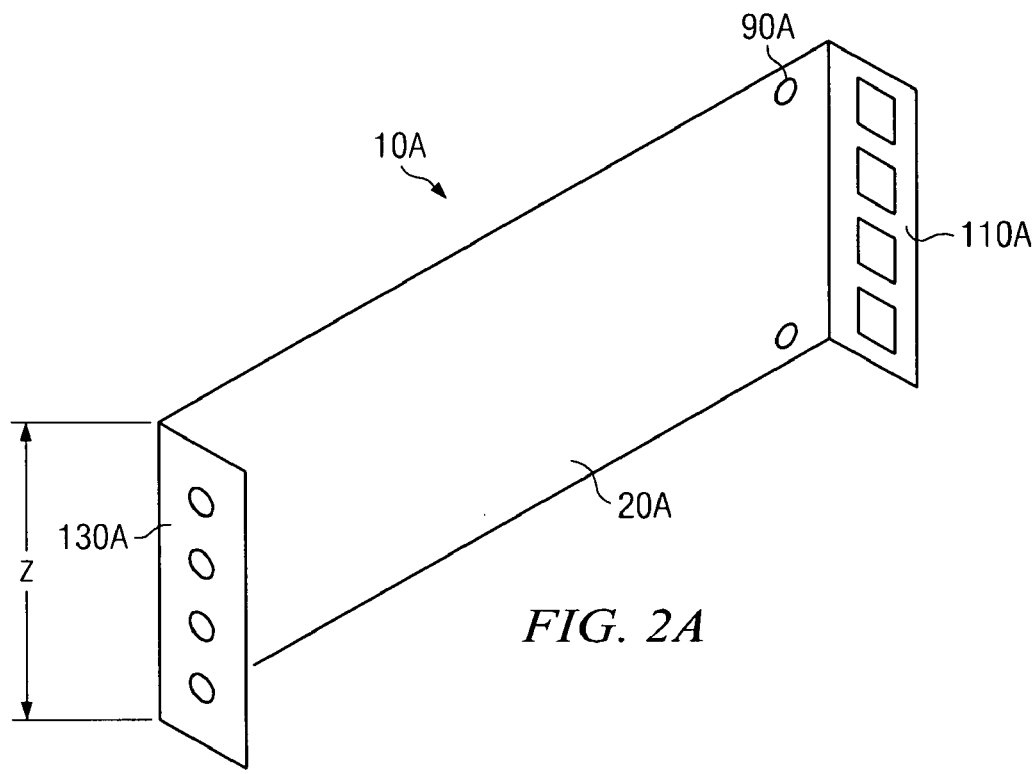
FIGS. 2A and 2E are perspective elevated views of the coupling member of FIG. 1 in alternate embodiments.

Referring now to FIG. 2A, there is shown a perspective view of a coupling member 10A in an alternate embodiment, with like numerals being designated for like parts. This embodiment is similar to coupling member 10 of FIG. 1. In this embodiment, the vertical support member 20A is not provided with any openings. This embodiment supports loads in a similar fashion as the coupling member 10 of FIG. 1. The thickness of the vertical support member 20A, and the flanges 130A, 140A may be adjusted to compensate for the loss of the first torsion member 70 and the second torsion member 80 in the embodiment of FIG. 1. The height Z of the flange 130A may be adjusted to compensate for the loss of the lower flange end adapted to act as a pivot point in the embodiment of FIG. 1.

Figure 2B:
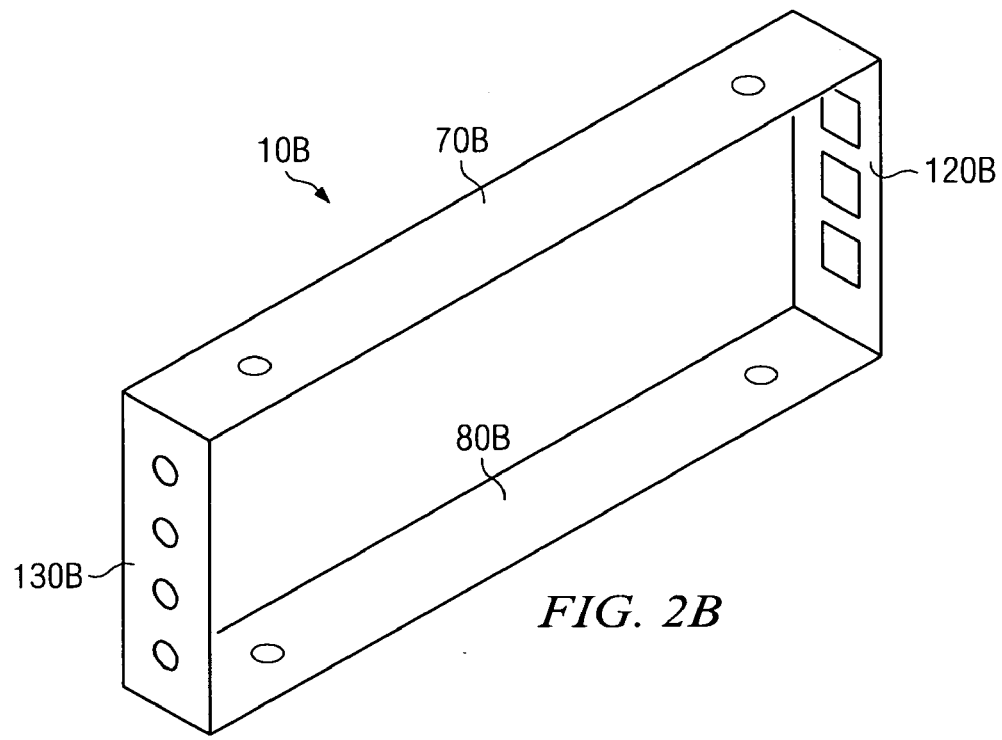

Referring now to FIG. 2B, there is shown a perspective view of a coupling member 10B in an alternate embodiment, with like numerals being designated for like parts. This embodiment is similar to coupling member 10 of FIG. 1. In this embodiment, first torsion member 70A and second torsion member 80B extend to the equipment attachment flange 120A and to the rack attachment flange 130B. In addition, the vertical support member 20B is not provided with any openings. This embodiment supports loads in a similar fashion as the coupling member 10 of FIG. 1.

Figure 2C:
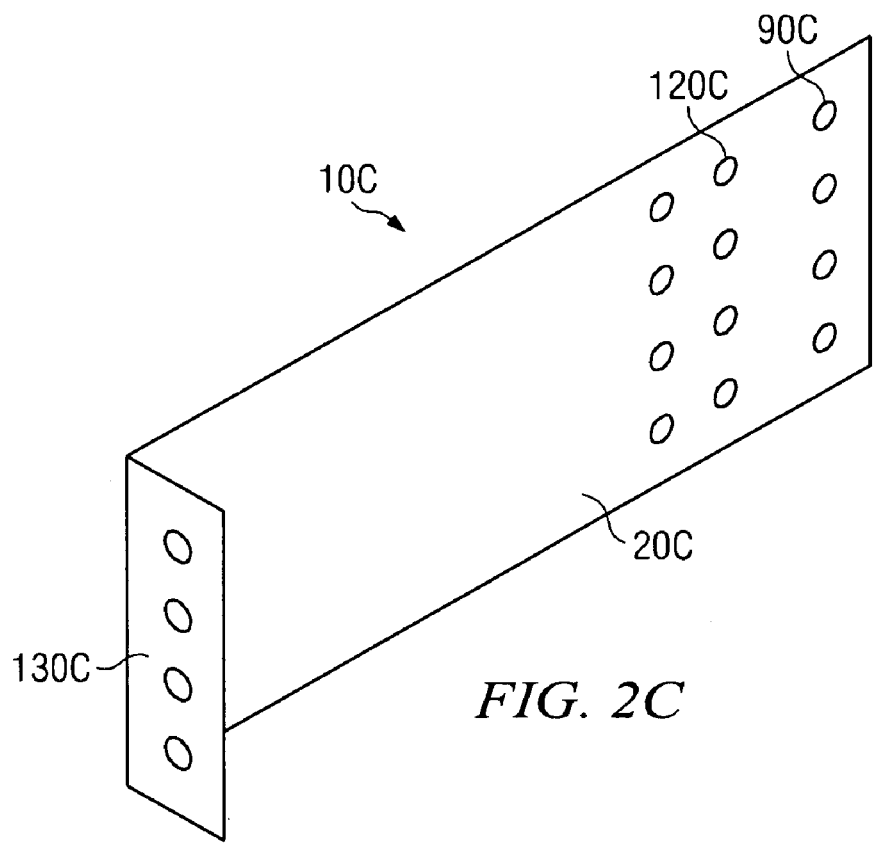
Figure 2D:
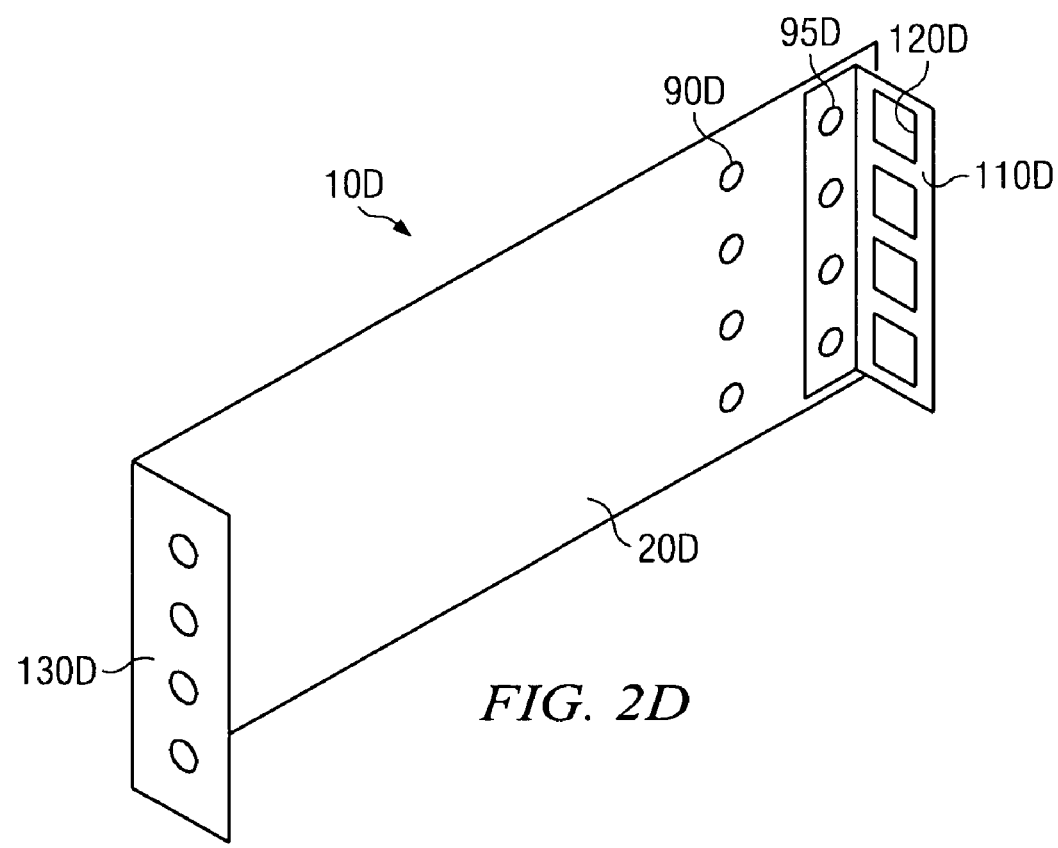
Figure 2E:
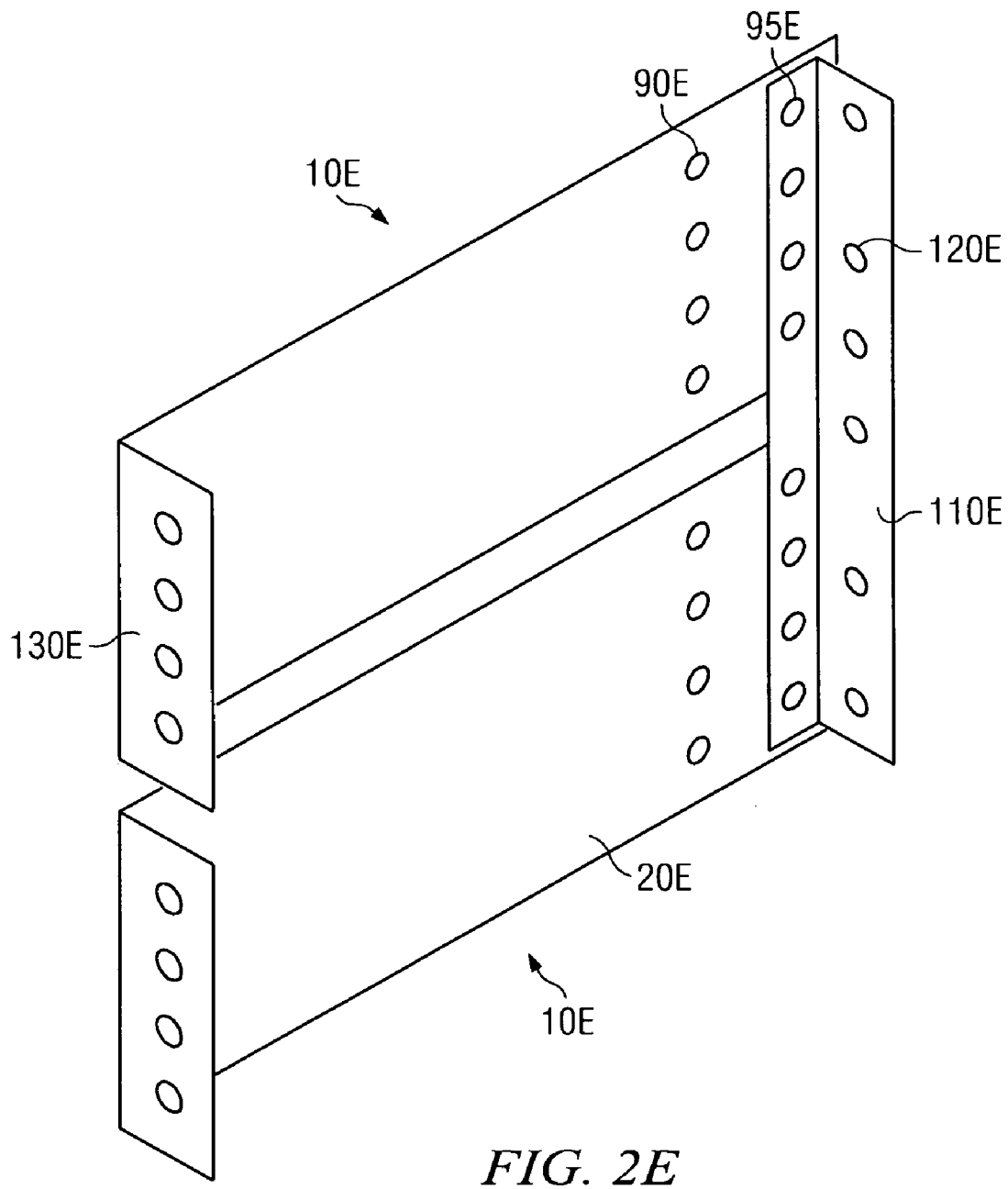

Referring not to FIGS. 2C-2E, there is shown yet other embodiments of the coupling member 10C, 10D, and 10E. In FIG. 2C, coupling member 10C includes rack attachment flange 130C coupled to the vertical support member 20C. However, instead of an equipment attachment flange, a plurality of holes 120C are provided on the vertical support member 20C for securement to a flange and the like (not shown). The holes 90C, which are similar in location to the plurality of holes 120C, may be used for coupling the coupling member 10C to adjacent coupling members (not shown).

FIG. 2D shows a coupling member 10D having an equipment attachment flange 110D secured to the vertical support member 20D via the openings 95D. The holes 90D may be used for coupling the coupling member 20D to adjacent coupling members (not shown).

FIG. 2E is yet another embodiment of a two coupling members 10E. This embodiment provides one equipment attachment flange 110E coupling more than one coupling members 10E to one another while also allowing coupling of the coupling members 10E to equipment (not shown). The equipment attachment flange 110E is modular, and may be placed on holes 90E.

Referring now to FIGS. 5A and 5B, there is shown a top plan view of the rack attachment flange 130 of the coupling member 10 and a cross-section view of the rack attachment flange 130 taken along line A-A, respectively. In this embodiment of the rack attachment flange 130, the torsion members 70, 80 extend beyond the rack attachment flange 130. The rack attachment flange 130 is also bent at an acute angle, Δ, such that when the rack attachment flange 130 is secured to a two-post equipment rack (not shown in FIGS. 5A, 5B), a spring-effect results from the contact of the torsion members 70, 80 to the two-post equipment rack and the coupling of the rack attachment flange 130 to the two-post equipment rack. This has the effect of pre-loading the coupling member 10, such that when a load is applied, the deflection of the coupling member 10 is minimized.

In some embodiments, Δ may be as little as several tenths of a degree or as great as several degrees. The exact calculation of the angle Δ may be determined through calculation of the desired loading, and may therefore vary from application to application. It is recognized that although the pre-loading configuration of the rack attachment flange 130 is preferred, the rack attachment flange 130 may be in a substantially perpendicular or perpendicular relationship with the vertical support member 20 of the coupling member 10.

Figure 12:
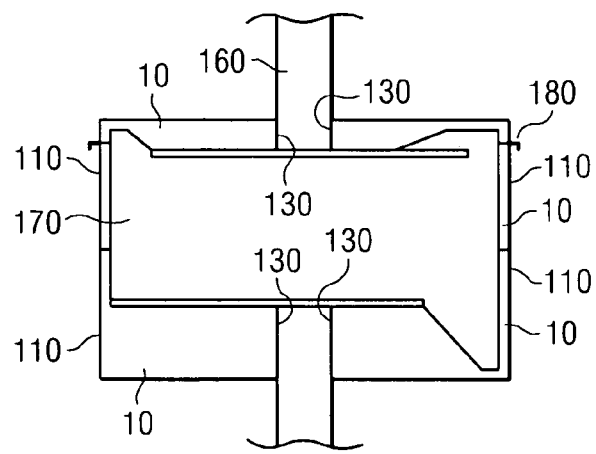
FIG. 12 is an exemplary side view of four coupling members secured to a post.

Referring now to FIG. 12, there is shown a side view of four coupling members 10 secured to a post 160 having a load, in this case a slide assembly 170, attached thereto. From this view, it is apparent that other loads, such as equipment and the like, may be secured to the coupling members 10 via the equipment flanges 110. Although not shown, in this configuration the coupling members 10 may be secured to one another via coupling features 90 located on torsion members 70, 80 of the coupling member 10. This configuration is adapted to support loads that may exceed the load-bearing capacity of two coupling members 10. Other slide assemblies 160 conventional in the art may be adapted to as few as one coupling member 10, depending on the requirements of the application. It is contemplated that some slide assemblies 170 may be specifically designed to adapt to coupling members 10, although such design may not be necessary, given the design of the coupling member 10. It is further contemplated that some slide assemblies 170 may be specifically designed to adapt to the vertical support member 20, and thus eliminate the need for the equipment attachment flange 110.

In this configuration, the slide assembly 170 secures to the equipment attachment flange 110 via one or more of the orifices 120 (FIG. 1) through connectors 180 on the slide assembly. Because the coupling members 10 are provided with one or more orifices 20, the number and types of connections between the load and the equipment attachment flange 110 may vary, such connection means being contemplated as within the scope of this invention.

The connection between the slide assembly 170 and the coupling member 10 does not affect the securement of additional loads, such as equipment and the like, to the coupling member 10. In certain embodiments, a slide assembly 170 may not be required, as some applications currently do not require the use of a slide assembly 170.

For example, referring now to FIG. 6, there is shown a perspective view of a converted two-post equipment rack having the coupling members 10, 10A secured thereto and supporting loads 190A, 190B thereon. As can be seen, slide assembly 170 is mounted on the coupling member 10 and the first load 190A secured to the slide assembly 170. Because the first load 190A exceeds the load bearing abilities of one coupling member 10, an adjacent additional coupling member 10A is coupled thereto to provide increased load support. Because the load 190A travels on one side of the posts 160, only one coupling member 10 is needed on the opposite side of the post 160.

Still referring to FIG. 6, load 190B is secured to a coupling member 10 without the use of slide assembly 170. In this configuration, the load 190B spans both sides of the post 160. Further, it can be seen that cables 195 extending from load 190B can be secured to the openings 150 of the coupling member 10 via tie-wraps and the like (not specifically shown). It can be appreciated that the coupling member 10A may alternately be used to support the loads 190A, 190B, should such be desired. It can further be appreciated that the coupling members may be arranged in any number of configurations depending on the load being supported and the requirements of the system. Such configuration is left to discretion, with such configurations considered to be within the scope of the present invention.

Coupling member 10 is preferably made of metal, and is preferably made in a process whereby a sheet of metal is first placed in a stamping machine as understood in the art. The requisite parts of the metal are stamped in one or more steps and separated from the remaining portion of the sheet. Next the perforated metal is delivered to a crimping device, which bends the torsion members, the equipment attachment flange, and the rack attachment flange to their predetermined angles. In some embodiments, the rack attachment flange is bent at an acute angle relative to the vertical support member in order to place the coupling member in a pre-loading configuration. The bent metal sheet may then be subjected to an anti-corrosive process, such as by painting the coupling member, and may be imprinted with textual and numerical script. Other processes, such as progressive die stamping and casting the coupling member from a pre-fabricated cast, are contemplated to be within the scope of the present invention. Still yet, other non-metal materials may be utilized to form the coupling member 10.

Figure 3A:
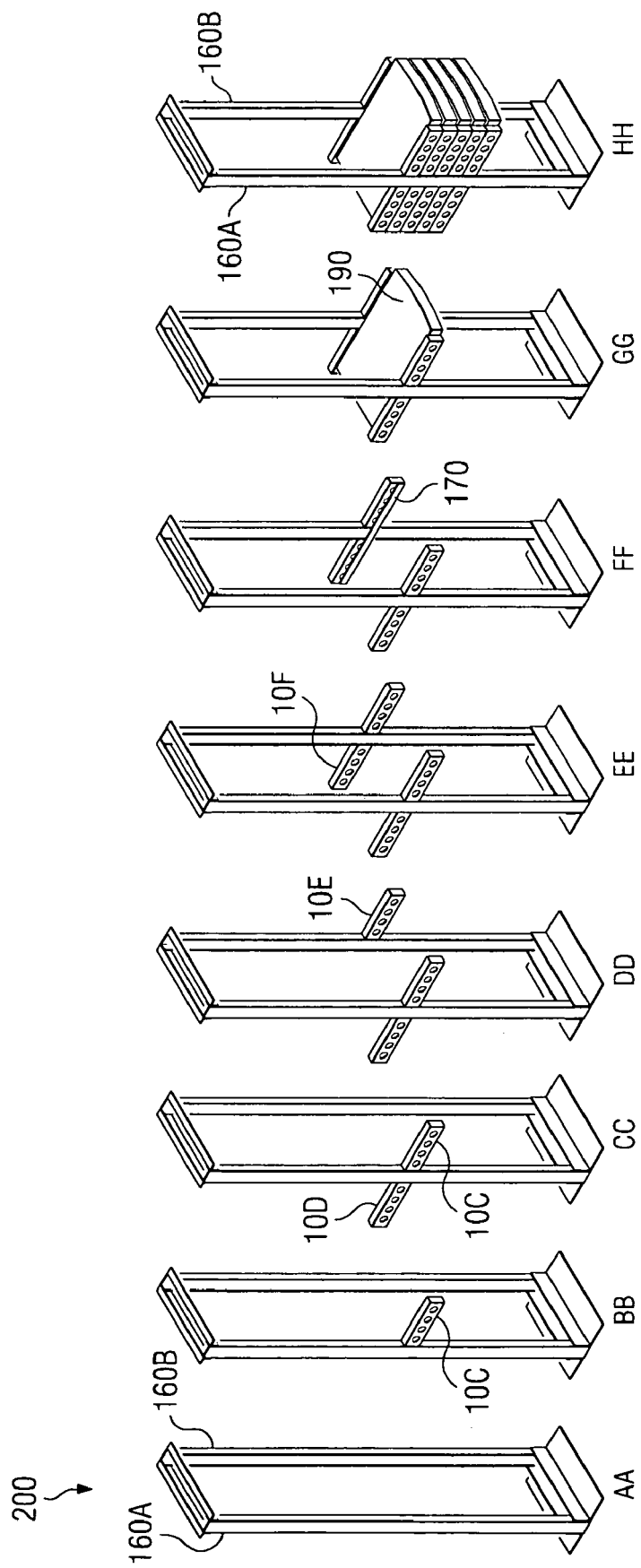
FIG. 3A is an exemplary perspective installation sequence for converting a two-post equipment rack including the coupling member of FIG. 1 and/or FIG. 2 to support four-post equipment.
Figure 3C:
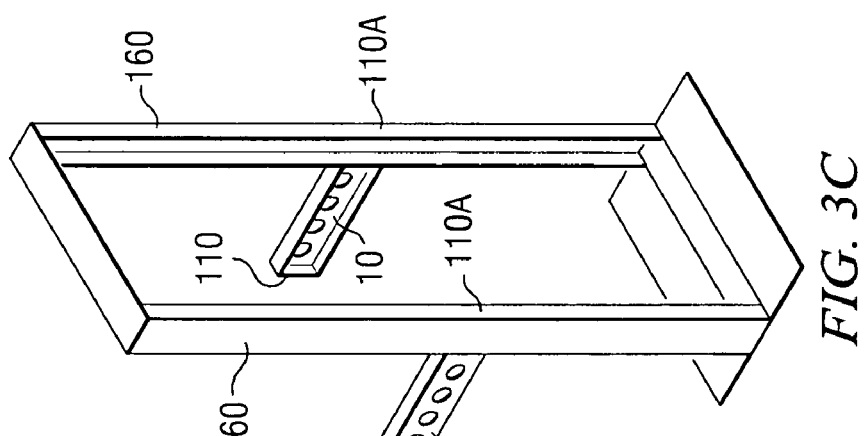
FIG. 3C is an exemplary perspective view of a converted two-post equipment rack in a different configuration from FIG. 3A.
Figure 3B:
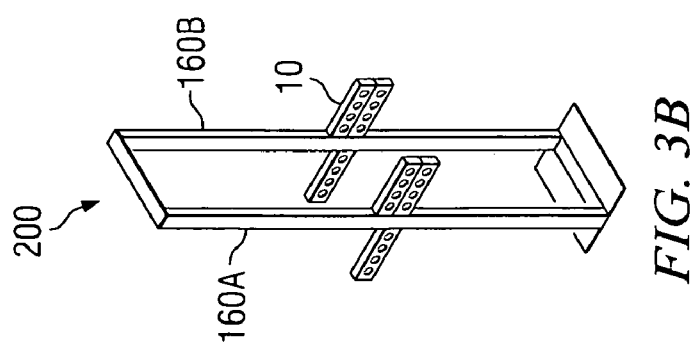
FIG. 3B is an exemplary perspective view of a converted two-post equipment rack in a different configuration from FIG. 3A.

Referring now to FIGS. 3A and 3B, there is shown a perspective exemplary installation sequence for converting a two-post equipment rack to support four-post equipment, and an exemplary configuration of a converted two-post equipment rack. A two-post equipment rack 200 having a first post 160A and a second post 160B is first provided, designated by AA. A first coupling member 10C is coupled to a first side of post 160A, as designated by BB. Next, a second coupling member 10D is coupled to a second side of the post 160B substantially planar to and substantially parallel to the first coupling member 10C, designated by CC. Likewise, a third and fourth coupling member 10E, 10F are secured on a first side and a second side of a second post 160B, as designated by EE and FF. After completing this step EE, the user has now coupled independent four-post replicating mounting points on the two-post rack 200. A slide assembly 170, if needed, may then be attached to the inside-facing sides of the coupling members 10C, 10D, 10E and 10F.

The four-post emulated mounting points now can support four-post loads such as slide assembly 170 or other loads 190, as shown by FF and GG. A load 190, as such as equipment, may then be secured to the slide assembly 170. In this case, the load is transferred through the slide assembly 170 to the coupling members 10C, 10D, 10E and 10F. It is contemplated that some loads do not require slide assemblies. A load 190, such as equipment not needing slide assemblies, may then be directly secured to the coupling member 10C, 10D, 10E and 10F as required, designated by GG. More coupling members 10 may be secured to the posts 160A, 160B as required and more loads 190 may be secured thereto, designated by HH. The coupling members 10 may be secured in a manner as determined by the requirements of the load, as shown in the exemplary configuration of FIG. 3B. Each coupling member 10 may be coupled the adjacent coupling member 10 using a the coupling feature 90 shown in FIG. 1, thereby increasing the load capacity and structural integrity of each coupling member 10.

Referring now to FIG. 3C, an exemplary embodiment is shown having two equipment attachment flanges 110, and two attachment points 110A provided on the posts 160. This structure now forms an equivalent four-post rack. It can be seen from FIG. 3C that a load would not be centered. But a load in FIG. 3A would be substantially centered. Centering of the loads would have the added advantage of balancing loads in the rack, but in some circumstances, such as when spacing requirements are confined, it may not be possible to center the load.

Figure 4:
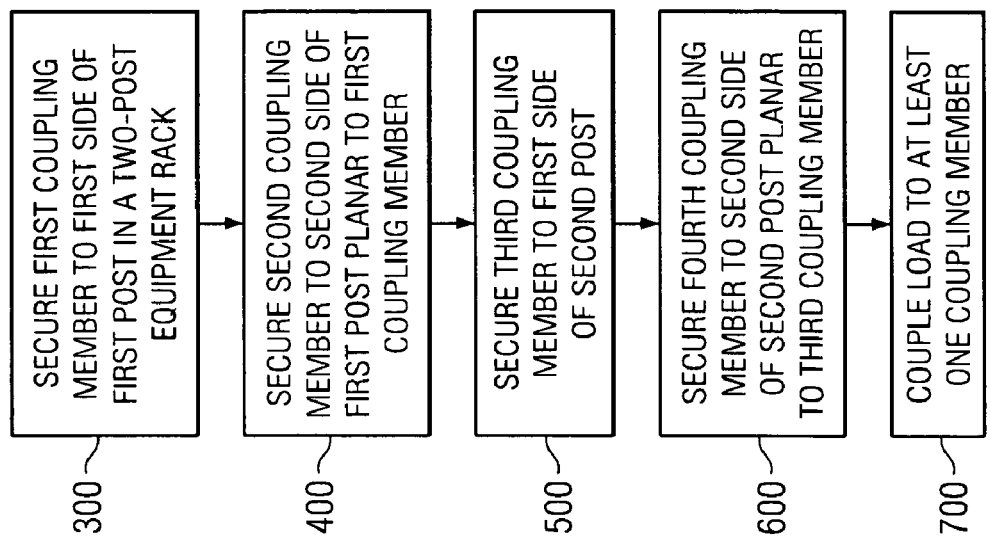
FIG. 4 is an exemplary schematic flow chart depicting steps for converting a two-post equipment rack including the coupling member of FIG. 1 and/or FIG. 2 to support four-post equipment.

Referring now to FIG. 4, there is shown a schematic exemplary installation flow chart for converting a two-post equipment rack to support four-post equipment. First, a first coupling member may be coupled to a first side of a first post of a two-post equipment rack, as shown by box 400. Second, a second, third and fourth coupling member may be coupled to the respective sides of the respective posts, shown in boxes 400, 500 and 600. Finally, a load may be coupled to at least one coupling member, as shown in box 700. Other installation sequences varying the connection order are contemplated to be within the scope of the principles of the present invention.

Referring now to FIGS. 8A-E, there is shown an exemplary side view of a load 1103 coupled to a two-post rack utilizing coupling members in accordance with the principles of the present invention. A post 1101 of a two-post equipment rack is shown. Two coupling members 1102 are provided outward from the post 1101. The coupling members 1102 may be coupled to the post 1101 in any configuration, inasmuch as the coupling members 1102 are sufficiently secured to the post 1101 so that the coupling members 1102 may support a load 1103. In this exemplary view, a load 1103 is secured to the coupling members 1102 and supported thereby. The structure of the coupling members 1102 may vary, depending on the requirements of the system.

In certain embodiments, the coupling members 1102 may have angled connection points to the post 1101. In other embodiments such as those shown in FIGS. 8A-E, examples of coupling members are shown in various configurations. As can be seen, these coupling members all function to support a load while replicating a four-post equipment rack, such that four-post equipment may be placed thereon. In some embodiments, such as that shown in FIG. 8C, the coupling member 02 may be one integral member that provides contact points 1105 on one or either side of the post 1101.

At least one commercially-available rack has a front-to-back-post depth of about 28.875". It can be appreciated that the present invention can provide a plurality of coupling members on such a rack or other commercially-available racks and, through placement of the coupling members, adjust the forward and/or aft depth to match the intended commercially-available rack. Further adjustments to the coupling members, including conversion of the mounting features, are contemplated to be within the scope of the present invention. The advantage of replicating a specific commercially-available rack made by vendor W is the loads made by the rack-equipment manufacturer W to fit in W racks will also fit in the emulated rack, thereby eliminating costly unnecessary equipment modifications. Such replicating devices can function as an equipment support device, depending on the application.

Figure 13:
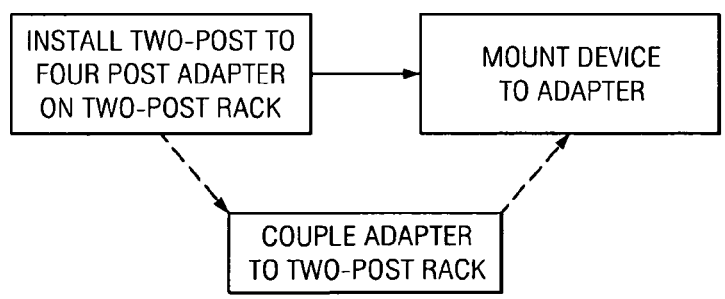
FIG. 13 is an exemplary flow chart for providing a two- to four-post adapter according to the principles of the present invention.

FIG. 13 is an exemplary flow chart for providing a two- to four-post adapter according to the principles of the present invention. In this embodiment, features of the present invention are accomplished by installing a two-post to four-post adapter on a two-post rack, shown by box 1300. Next, a device may be mounted to the adapter, shown by box 1310. Optionally the adapter may be coupled to the two-post rack shown by box 1320.

It should be understood that the present invention provides for a method for enabling the rack mounting of a device having a four-post rack-mounting configuration to a two-post rack system by providing a two-post to four-post adapter on a two-post rack system. Such two-post to four-post adapter is preferably operable to support a device, including slide assemblies and electronic devices such as computer servers, having a four-post rack-mounting configuration. In some embodiments, the two-post to four-post adapter may include at least two coupling members. Other steps that may be taken in accordance with the principles of the present invention include measuring hardware that has a four-post rack-mounting configuration to provide for the configuration of the device and specifying dimensions for the two-post to four-post adapter based on this measuring. Additional steps may include selling, distributing, including, offering for sale, advertising, and marketing the apparatus and method disclosed herein. Some two-post to four-post adapters may be provided with the two-post rack system. Some two-post to four-post adapters may alternately be provided with the four-post rack mount equipment.

It should also be understood that there are many aspects to the conversion apparatus and method, and the scope of the principles of the present invention should not necessarily be limited by the description found herein. It is thus believed that the operation and construction of the principles of the present invention will be apparent from the foregoing description of the preferred exemplary embodiments. It will be obvious to a person of ordinary skill in the art that various changes and modifications may be made herein without departing from the spirit and the scope of the invention.

The scope of the present invention is instead defined by the following claims.

What is claimed is:

1. A method for converting a two-post equipment rack to support four-post loads, the method comprising:

coupling independent four-post replicating mounting points on the two-post equipment rack, said four-post replicating mounting points operable to support the four-post loads, wherein said mounting points comprise two or more independent coupling members, and wherein each coupling member is operable to vertically support the four-post loads at a first lateral end and to attach to only one respective post at a second lateral end;

attaching equipment configured to couple to four-post equipment racks to a first lateral end of a first coupling member;

attaching a second lateral end of the first coupling member to a first post of a two-post equipment rack;

attaching the equipment configured to couple to four-post equipment racks to a first lateral end of a second coupling member; and attaching a second lateral end of the second coupling member to a second post of the two-post equipment rack.

2. The method of claim 1, wherein said four-post replicating mounting points comprise four coupling members.

3. The method of claim 1, wherein at least one of said four-post replicating mounting points comprises:

an equipment attachment flange coupled to the first lateral end, said equipment attachment flange being adapted to emulate a vertical upright in a four-post equipment rack, said equipment attachment flange being further adapted to secure to a load; and a rack attachment flange coupled to the second lateral end of said vertical support member.

4. The method of claim 1, wherein at least one of said four-post replicating mounting points comprises:
- a vertical support member having a first longitudinal end and a second longitudinal end;
- a first torsion member coupled to the first longitudinal end; and
- a second torsion member coupled to the second longitudinal end.

5. The method according to claim 1, wherein each coupling member is operable to vertically support the four-post loads at a first lateral end without supportably engaging the four-post loads along a longitudinal dimension of the coupling member between the first lateral end and the second lateral end.

6. The method according to claim 1, wherein attaching equipment to the first lateral end of the first coupling member comprises attaching equipment to the first lateral end of the first coupling member without attaching the equipment to any other part of the first coupling member and without any other part of the first coupling member providing vertical support for the equipment.

7. The method according to claim 1, wherein each first lateral end comprises a flange having a plurality of holes.

8. The method according to claim 7, wherein the flange is coupled to the first lateral end using a fastener.

9. The method according to claim 7, wherein the holes are arranged vertically in sets of three holes.

10. A method for adapting a two-post equipment rack to support four-post loads, the method comprising:
- coupling a first coupling member to a first post at a first end of the first coupling member, the first coupling member further comprising a second end;
- coupling a second coupling member to a second post at a first end of the second coupling member, the second coupling member comprising a second end, wherein said first coupling member and said second coupling member emulate two of the four posts in a four-post rack with each emulated post defining a vertical supporting point for a load;
- attaching a load having a first attachment point, a second attachment point, a third attachment point, and a fourth attachment point, wherein the load is adapted to mount to a four-post rack at each of the four attachment points of the load by:
- attaching the first attachment point of the load to the second end of the first coupling member;
- attaching the second attachment point of the load to the second end of the second coupling member;
- attaching the third attachment point of the load to the first post; and
- attaching the fourth attachment point of the load to the second post, wherein the first post and the second post of the two-post equipment rack emulate the other two posts of the four posts in the four-post rack with each post defining a vertical supporting point for a load.

11. The method for adapting a two-post equipment rack to support equipment configured to couple to four-post equipment racks, the method comprising:
- coupling a first coupling member to a first post at a first end of the first coupling member, the first coupling member further comprising a second end;
- coupling a second coupling member to a second post at a first end of the second coupling member, the second coupling member further comprising a second end;
- coupling a third coupling member to the first post at a first end of the third coupling member and substantially planar to and substantially parallel to said first coupling member, the third coupling member further comprising a second end;
- coupling a fourth coupling member to the second post at a first end of the fourth coupling member and substantially planar to and substantially parallel to said third coupling member, the fourth coupling member further comprises a second end; wherein the second end of each of the coupling members emulates one respective post in a four-post rack, with each emulated post defining a supporting point for a load.

12. The method of claim 11, further comprising:
attaching a load having a first attachment point, a second attachment point, a third attachment point, and a fourth attachment point, wherein the load is adapted to mount to a four-post rack at each of the four attachment points of the load by:
- attaching the first attachment point of the load to the second end of the first coupling member; and
- attaching the second attachment point of the load to the second end of the second coupling member;
- attaching the third attachment point of the load to the second end of the third coupling member; and
- attaching the fourth attachment point of the load to the fourth coupling member.

13. The method of claim 12, wherein said load comprises a slide assembly.

14. The method of claim 11, further comprising: securing a fifth coupling member to said first post; and securing a sixth coupling member to said second post.

15. The method of claim 14, further comprising: coupling said first coupling member to said fifth coupling member.

16. A method for enabling rack mounting of a device having a four-post rack-mounting configuration to a two-post rack system, the method comprising:
- providing a two-post to four-post adapter on the two-post rack system, the two-post to four-post adapter operable to support the device having a four-post rack-mounting configuration.

17. The method according to claim 16, wherein the two-post to four-post adapter includes at least two coupling members.

18. The method according to claim 16, further comprising: measuring hardware providing for the configuration of the device having the four-post rack-mounting configuration; and specifying dimensions for the two-post to four-post adapter based on said measuring.

* * * * *